United States Patent
Tang et al.

[11] Patent Number: 5,880,362
[45] Date of Patent: Mar. 9, 1999

[54] METHOD AND SYSTEM FOR SIMULATING VEHICLE AND ROADWAY INTERACTION

[75] Inventors: Yue-Li A. Tang, West Bloomfield; Timothy J. Palmer, Shelby Township, both of Mich.

[73] Assignee: Engineering Technology Associates, Inc., Madison Heights, Mich.

[21] Appl. No.: 706,582

[22] Filed: Sep. 5, 1996

Related U.S. Application Data

[60] Provisional application No. 60/003,303 Sep. 6, 1995.
[51] Int. Cl.$^6$ .......................... E01C 23/00; G01M 17/02
[52] U.S. Cl. ............................................... 73/146
[58] Field of Search ................. 73/146, 669, 862.08, 73/865.6; 340/932.2, 943; 434/11, 29, 55, 58, 62, 69, 71

[56] References Cited

U.S. PATENT DOCUMENTS

| | | | |
|---|---|---|---|
| 4,383,827 | 5/1983 | Foerst | 434/69 |
| 4,564,356 | 1/1986 | Winfree | 434/29 |
| 4,680,959 | 7/1987 | Henry et al. | 73/117 |
| 4,952,152 | 8/1990 | Briggs et al. | 434/69 |
| 5,173,692 | 12/1992 | Shapiro et al. | 340/943 |
| 5,277,584 | 1/1994 | DeGroat et al. | 434/29 |
| 5,368,484 | 11/1994 | Copperman et al. | 434/69 |
| 5,430,645 | 7/1995 | Keller | 364/424.01 |
| 5,610,330 | 3/1997 | Fricke et al. | 73/146 |

OTHER PUBLICATIONS

Body–Structure Durability Analysis Automotive Engineering—Jul. 1995 pp. 73–77.

*Primary Examiner*—William Oen
*Attorney, Agent, or Firm*—Harness, Dickey & Pierce P.L.C.

[57] ABSTRACT

The present invention is directed to a system and method for simulating the interaction of a simulated vehicle with one or more simulated road surfaces. A computer modelling program is used to create a computer-based road surface model and a computer-based vehicle model. The computer-based vehicle model may include a body model, a chassis model, a suspension model, a wheel model and a tire model. A computer simulation engine program is operative with the computer-based road surface and vehicle models to selectively simulate the interaction therebetween and provide simulation data relative thereto. The simulation data may be used to identify high stress areas or low durability areas of the vehicle or to compute vehicle suspension parameters.

16 Claims, 2 Drawing Sheets

METHOD AND SYSTEM FOR SIMULATING VEHICLE AND ROADWAY INTERACTION

REFERENCE TO PRIOR APPLICATIONS

This application claims the benefit of a U.S. Provisional Application No. 60/003,303, filed Sep. 6, 1995.

FIELD OF THE INVENTION

The invention is an improved system and method for simulating the interaction of a motor vehicle and a road surface, and specifically, pertains to a system and method of using computer models of a vehicle's wheels and tires to evaluate vehicle performance in relation to a computer model of a roadway.

BACKGROUND

Systems for the simulation of vehicle operation are well known. Among these systems are vehicle operating simulators, which can be operated by a driver manipulating conventional controls and producing visual, aural and tactile feedback, such as those taught by Briggs, et al, in U.S. Pat. No. 4,952,152 and DeGroat, et al, U.S. Pat. No. 5,277,584.

Systems for the analysis of the forces imposed on a motor vehicle during operation are also well known. Using traditional finite element analysis (FEA) techniques, it is possible to construct so-called FEA models of vehicles and their component parts utilizing a computer, and further, to use the computer to simulate forces acting upon the vehicle computer model to determine and predict stress, strain, durability and fatigue of vehicle components.

Our own finite element model builder system is an example of the current state of the art in the creation of finite element models using finite element analysis. With these systems, the structure of a motor vehicle body, chassis, drive train, suspension and other component parts can be created as a computer model. Manipulation of this model can then be performed in a variety of ways to assist the vehicle designer. The model can be viewed on a typical video display device, which allows the designer and engineer to rotate the view of the model, manipulate the components of the model and test the results of said manipulation or modification of the model.

Our software also interfaces with a wide variety of other computer programs, for example, computer programs which assist in the designing of production tools.

It is also known to utilize FEA models in a dynamic simulation environment. For example, a motor vehicle suspension model can be subjected to a repetitive computer-simulated force comparable to that force imposed on an actual motor vehicle suspension, e.g., the vehicle's encounter with a roadway pothole. By repeating this simulation, repetitive stresses on suspension components can be effectively evaluated, without the need to actually subject the physical component to the physical roadway conditions, in a much shorter time at less expense than that required by actual operation of a vehicle in the proving ground environment.

An underlying problem with prior simulation methods and systems is the imprecision of the inherent estimations which are required to run the simulations. For example, in prior art "pothole" simulations, the systems assumed that the forces transmitted by the impact of the motor vehicle tire with a pothole would result in an isolated vertical force being applied to the vehicle's suspension and body. In reality, the pothole also results in a rearward force on the vehicle's suspension when the vehicle tire strikes the vertical surface of the pothole as the vehicle travels forward. Further, prior simulation techniques largely ignored the size, shape, mass, geometry and dynamics of the wheel/tire combination, and treated forces applied to the motor vehicle suspension and vehicle body as essentially point source forces at particular points in the vehicle suspension. Such assumptions have been shown to provide largely inaccurate simulation data.

The present invention allows for the modeling and simulation of all vehicle components in the proving ground environment. Previous systems have been limited to the simulation of various vehicle sub-systems, but not the vehicle as a whole. The present invention also provides better consistency between successive tests and better consistency within specific model configurations. By providing an accurate model of both the vehicle and the road surface, any change in the individual model elements (e.g., the tire model) will isolate the effects of substitution of different elements under consideration, provided all other vehicle components and models remain unchanged.

SUMMARY OF THE INVENTION

Utilizing the system and method of the present invention, a computer-based model of a motor vehicle is created. Thereafter, additional computer models of various vehicle components, including the suspension, wheels and tires are created. Finally, a computer model of a typical test roadway surface is created. Once all required computer models have been generated, the vehicular components are combined into a virtual vehicle for computer analysis. The virtual vehicle is placed on a virtual roadway derived from the roadway model, digitized from the proving ground test track surface profile for example, and the elements of the vehicle and roadway are manipulated by computer analysis software which simulates the interaction between the virtual vehicle and the virtual roadway under various conditions of vehicle load, highway speed and maneuvering of the virtual vehicle in relation to the virtual highway. The stresses due to the forces imposed on the virtual vehicle during this analysis may be collected and analyzed by, among other means, computer-based fatigue analysis techniques. The data so obtained and analyzed can be displayed in the form of raw data, or in the form of graphic computer models which isolate and identify data of interest to vehicle designers and engineers, such as areas of high stress or low durability. The data may also be used to calculate and plot suspension parameters over the duration of the simulated interaction between the virtual vehicle and the virtual roadway. Such suspension parameters are valuable to suspension designers, development engineers, etc. in evaluating the effects of camber or toe change, caster, steer axis inclination, vehicle roll center, roll stiffness, anti-dive and anti-lift characteristics, and may be used to modify the vehicle suspension to achieve desired handling characteristics.

BRIEF DESCRIPTION OF THE DRAWINGS

The objects, features and advantages of the present invention and this application will be more readily appreciated when read in conjunction with the accompanying drawings, in which.

DESCRIPTION OF THE PREFERRED EMBODIMENT

The system for simulating the vehicle/roadway interaction of the present invention comprises a computer having at least one input device, preferably at least one video display device, at least one hard copy output device such as a printer, at least one storage device, such as a disk drive having either removable or non-removable media, a computer program in the form of a finite element modelling program, and a second computer program in the form of a dynamic non-linear real-time simulation analysis module.

The finite element modelling system is preferably of the type which we have authored, entitled "Finite Element Model Builder", and sold under the trademark "FEMB". This type of software accepts data regarding the dimensions, design, structure and mass of a physical component, such as a motor vehicle body, and creates a computer-based model of such a component. Models so created may be viewed as either solid or semi-transparent "wire mesh" images on a computer screen or output device. These models can be easily manipulated by the computer operator, e.g., the models can be rotated in three dimensions to permit the view of any surface. The models can be viewed in any of the classic engineering drawing views, as well as in any cross-section in any such view. Elements may be added to or removed from the model. Simulated forces can be imposed upon the model, and elements of the model can be deformed. These capabilities make it simple for the user of such computer programs to evaluate the integrity of the model without the necessity for actually constructing a physical object conforming to the model. While traditional CAD software is generally used to create the basic structures which are then converted to FEA models, software such as that described above has the capability of including its own integrated CAD generator.

Figure 1:
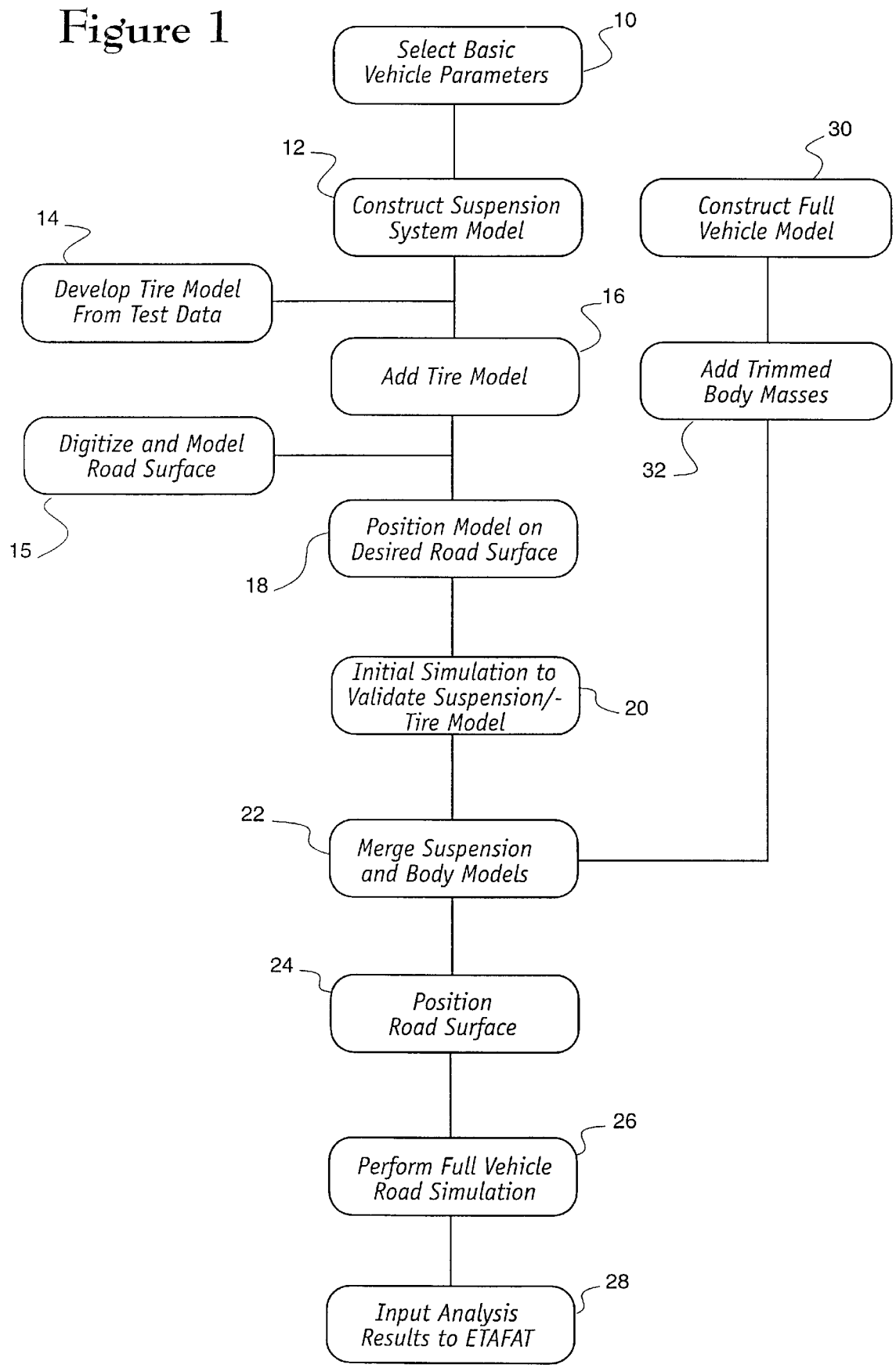
FIG. 1 is a system flow chart of a second embodiment of the method of the invention.

The preliminary step in the preferred embodiment of the invention is the selection of basic vehicle parameters 10 as shown in FIG. 1. While a detailed vehicle model may be utilized as explained herein, a preliminary evaluation of the suspension system and suspension/roadway interaction may be accomplished utilizing a simple vehicle wire model having a fixed mass.

The next step 12 in the inventive method is the creation of a vehicle suspension model utilizing the same techniques above-described. In the first embodiment of the invention herein described, the vehicle suspension model is created without concern for the detailed specific physical structure of the vehicle, and instead of the creation of a detailed computer vehicle model, the suspension model is created in relation to a simplified vehicle body and chassis model, which comprises only a single element having a prescribed mass, but no particular physical structure. There are many benefits of this method. By reducing the number of vehicle components which are modelled and simulated, the calculations required during the analysis steps are drastically reduced. A full vehicle model, including tires, wheels, suspension, body, seats, engine, transmission and other components can consume several days of simulation computations. A simple suspension model, without a vehicle body and other vehicle components in detail, will enable the simulation to be completed much faster.

After the creation of the suspension model, the method contemplates the creation of a detailed wheel/tire model. First, an initial computer model of a tire having a certain size, weight and other specifications is developed 14 using conventional finite element modelling techniques. A dynamic analysis of the performance of this tire is then performed, again using standard dynamic non-linear real time simulation techniques. The results of this computer analysis are compared to the performance of the actual tire under actual operating conditions. The variation between the performance of the actual tire and computer model is recorded, and the computer model is then revised. This process is repeated until the computer model of the tire conforms to the actual performance of the tire under operating conditions. Once this series of revisions has been completed, a computer model of the subject wheel is created, and combined with the computer model of the tire to create a computer model of the known wheel/tire combination. The tire model is then combined 16 with the suspension model, as shown in FIG. 1.

The next modelling step comprises creation 15 of the computer model of the test roadway. Motor vehicle proving grounds have evolved to incorporate a variety of topological configurations, all of which may be created for use in the present inventive methodology. These configurations, known as road profiles, may include a pothole track to simulate a vertical loading conditions, a body twist track to simulate torsional loading conditions, a forward panic braking surface to simulate longitudinal loading conditions, a FIG. 8 or cornering track, which simulates maximum lateral loading conditions, a washboard surface which simulates a high frequency/low amplitude loading condition, and a chatter strip track, which simulates a high frequency/low amplitude vertical loading condition. These road profiles are designed to create harsh road conditions which make it possible to simulate the day to day conditions encountered by a wide variety of motorists, and to facilitate repetitive testing of vehicle durability and handling in a relatively short period of time.

Again, using finite element modelling techniques, one or more computer models of the road surface is created 15. In the preferred embodiment, the road surface is modelled as a strictly rigid and non-deformable surface. After the creation of each of the above-described models, each computer model of a road surface may be stored in computer memory or computer storage device. The road models are preferably constructed using drawings of proving ground surfaces and produce a cross-section of the road surface using CAD data in 3-dimensions. The model is then "positioned" 18 on the simulated roadway.

Thereafter, utilizing a simulation engine in the form of dynamic analysis software, such as LS/DYNA3D (commercially available from Livermore Software Technology Corporation), dynamic non-linear real-time simulation 20 of the vehicle is performed. This initial simulation constitutes a validation step to confirm validity of the suspension/tire model.

Initial velocity parameters of a full vehicle model are programmed into the vehicle model using the finite element modelling software. A pre-determined friction parameter between the tire model and the road surface model is input into the LS/DYNA3D program. The operator of the LS/DYNA3D program can select a duration of simulation for stand alone analysis. Further, the system operator may start and stop the simulation manually during the simulation process.

It is important to note that an initial time must be provided for the tire models to "settle". Initially, the tire models are placed between the road model surface so that there is no vehicle weight applied to the tire model. At the beginning of the simulation, the tires are compressed as the vehicle model "falls" onto the road as shown in FIG. 1, flow chart operation 24. Therefore, a certain amount of time is required to permit the tires to "settle" and reach their normalized compression. The model is initially positioned behind any intended obstacle thereby giving the tire models time to settle by the time the first obstacle model is encountered.

During the final simulation 26, the dynamic analysis software generates output files at various pre-determined times or positions. The suspension model provides a continuous data stream for identifying upper and lower limits of suspension movement during the simulation. This continuous data stream permits the operator to concentrate attention on particular areas of maximum stress on the vehicle.

The data generated by the analysis program can be further analyzed 28 by a fatigue analysis program, such as the ETAFAT program. The fatigue analysis program analyzes the data generated by the dynamic analysis program, and permits prediction of component life. Data generated by the analysis program may also be used to analyze and predict noise and vibration levels resulting from vehicle operation.

Data generated during the simulation may also be used to calculate and plot suspension parameters over the duration of the simulated interaction between the vehicle model and the road surface model. Such suspension parameters are useful to suspension designers and development engineers in studying the effects of camber, toe change, caster, steer axis inclination, vehicle roll center, roll stiffness, anti-dive and anti-lift characteristics, and may be used to modify the vehicle's suspension mounting locations, compliance, etc., in order to achieve desired vehicle handling characteristics.

A second embodiment of the method of the invention is diagramed in FIG. 1. In the first embodiment above, a preliminary evaluation of the performance of the vehicle suspension system in relation to the roadway can be obtained, utilizing only the most fundamental information regarding the motor vehicle under test. Utilizing advanced FEA modelling techniques, however, the alternative inventive method herein described contemplates the creation of FEA models of the desired motor vehicle. Construction of this model may include incorporation of vehicle accessories, prescribed vehicle loading, and even the presence of occupants within the vehicle. The computer model of the vehicle so created is stored, on an interim basis, in the computer's memory or storage device for subsequent manipulation as herein described. In the second embodiment, however, in addition to the steps above-outlined, a full vehicle model is constructed 30, to include the addition 32 of trimmed body masses in the steps in the inventive method. Thereafter, the alternate embodiment of the inventive method contemplates the merger 22 with the body model and suspension models prior to performing the final simulation 26. The second embodiment provides a much more accurate representation of the displacement, stresses, dynamic responses and fatigue life imposed on the motor vehicle.

Figure 2:
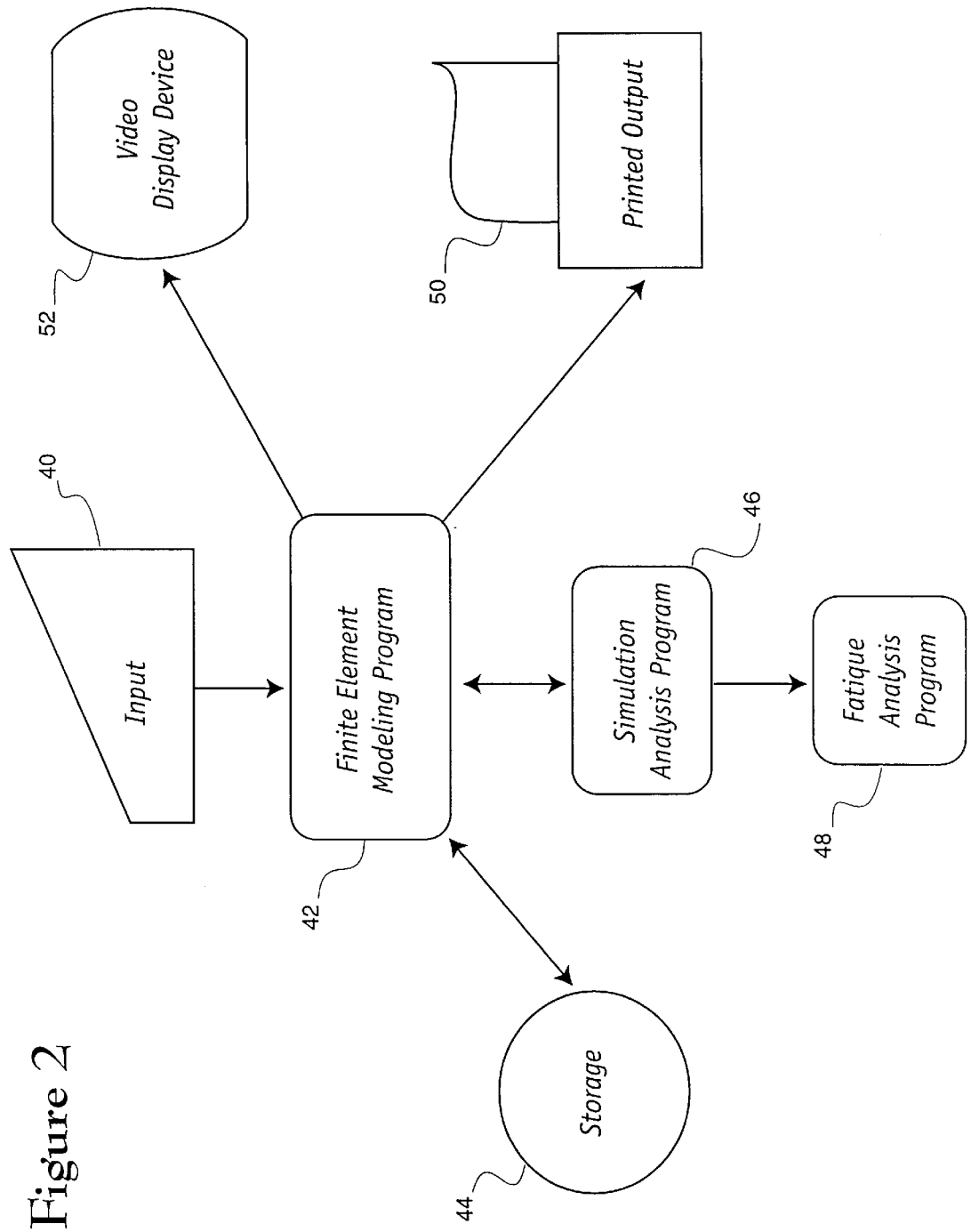
FIG. 2 is a flow chart and logic diagram of the various elements of the system of this invention.

The elements of the system are diagramed in FIG. 2. Basic input devices 40 utilized for the finite element modelling program include conventional keyboards, digital tablets, computer mouse and the like. These input devices are utilized to provide all necessary data to the finite element model program 42. Program 42 communicates, in the usual fashion, with storage device 44, video display device 52 and output device 50, preferably in the form of a printer. Finite element modelling program 42 further cooperates with the simulation analysis program 46 of the type commonly known as the LS/DYNA3D program above-described. The same analysis program cooperates with fatigue analysis software such as ETAFAT, also above-described.

The simulation can be repeated as needed, by substituting new road profile models, and by changing the various tire, wheel, suspension, vehicle and vehicle component models. For example, seats may be added or removed from the model, different door configurations may be selected for analysis, and computer models of occupants may be added to the computer model of the vehicle. Even minor changes to the parameters may be introduced, such as slight reductions in tire pressure or tire tread design.

While we have described this invention with reference to the above embodiments, it will be obvious to those skilled in the art that various modifications combinations of the above embodiments, as well as other embodiments of the invention may be easily made, without departing from the true scope of the invention.

The invention in which an exclusive property or privilege is claimed is defined as follows:

1. A system for simulating the interaction of a simulated vehicle with one or more simulated road surfaces, comprising:
   at least one computer including at least one programmable modelling program for creating both a computer-based model of one or more road surfaces, and a computer-based model of one or more vehicles, including at least the body, chassis, suspension, wheels, and tires thereof, and at least one programmable simulation engine program operative with said modelling program to selectively simulate the interaction between said one or more vehicle models and said one or more model road surfaces and provide simulation data relative thereto;
   entry means operative with said at least one computer for programming at least said modelling program and said simulation engine program;
   at least one storage and retrieval device operative with said at least one computer to both store and retrieve said simulation data, said one or more vehicle models, and said one or more road surface models; and
   at least one display device operative with said computer for displaying at least said simulation data.

2. The system of claim 1, wherein said at least one modelling program comprises a finite element-modelling program, and said simulation engine program comprises a non-linear dynamic analysis real-time simulation program.

3. The system of claim 1, wherein said computer further includes a fatigue analysis program operative to receive and analyze at least said simulation data.

4. The system of claim 1, further including one or more output devices comprising one or more printers, said one or more output devices operative to provide hard output of at least said simulation data.

5. The system of claim 1, wherein said data includes suspension parameters.

6. A method for simulating the interaction of a simulated vehicle with one or more simulated road surfaces, comprising the steps of:
   creating a computer-based model of at least a vehicle body and chassis, as well as the suspension system therefor;
   creating a computer-based model of both the wheels and tires for said vehicle body and chassis model, and combining said wheel/tire model with said suspension system to define a vehicle model;
   creating a computer-based model of one or more desired road surfaces; and
   combining said vehicle model and said one or more road surface models in a simulated engine to create a computer-based simulation of the interaction between said vehicle model and said one or more road surface models, said simulation providing data relative to one or more parameters of said interaction between said vehicle model and said one or more road surface models.

7. The method of claim 6, wherein the step of creating said computer-based model of said vehicle body and chassis comprises creating a simplified vehicle body and chassis having a fixed mass.

8. The method of claim 6, wherein the step of creating said computer-based model of said vehicle body and chassis comprises creating a vehicle body and chassis including trimmed body masses.

9. The method of either claim 7 or claim 8, wherein the step of creating said computer-based model for said wheels and tires further includes the steps of conducting at least one computer-based simulation of said model wheels and obtaining simulation performance data therefrom relative to the performance of said model wheels, obtaining data relative to the actual performance of actual wheels similar to said model wheels operating under actual conditions similar to the conditions of said simulation of said model wheels, comparing said simulation performance data to said actual performance data, and revising said model wheels until said simulation performance data conform to said actual performance data.

10. The method of claim 9, further including the step of calculating suspension parameters from said simulation data.

11. The method of claim 9, further including the step of analysing said simulation data using one or more fatigue analysis programs.

12. A method for simulating the interaction of a simulated vehicle with one or more simulated road surfaces, comprising the steps of:

creating a computer-based model of at least a vehicle body and chassis, as well as the suspension system therefor;

creating a computer-based model of both the wheels and tires for said vehicle body and chassis model, conducting at least one computer-based simulation of said model wheels to obtain simulation performance data relative to the performance of said model wheels, obtaining data relative to the actual performance of actual wheels similar to said model wheels operating under actual conditions similar to the conditions of said simulation of said model wheels, comparing said simulation performance data to said actual performance data, revising said model wheels until said simulation performance data conform to said actual performance data, and combining said wheel/tire model with said suspension system to define a vehicle model;

creating a computer-based model of one or more desired road surfaces; and combining said vehicle model and said one or more road surface models in a simulated engine to create a computer-based simulation of the interaction between said vehicle model and said one or more road surface models, said simulation providing data relative to one or more parameters of said interaction between said vehicle model and said one or more road surface models.

13. The method of claim 12, wherein the step of creating said computer-based model of said vehicle body and chassis comprises creating a simplified vehicle body and chassis having a fixed mass.

14. The method of claim 12, wherein the step of creating said computer-based model of said vehicle body and chassis comprises creating a vehicle body and chassis including trimmed body masses.

15. The method of either claim 13 or claim 14, further including the step of calculating suspension parameters from said simulation data.

16. The method of either claim 13 or claim 14, further including the step of analysing said simulation data using one or more fatigue analysis programs.

* * * * *